United States Patent [19]

Lippmann et al.

[11] Patent Number: 4,947,410

[45] Date of Patent: Aug. 7, 1990

[54] METHOD AND APPARATUS FOR COUNTING WITH A NONVOLATILE MEMORY

[75] Inventors: Raymond Lippmann, Ann Arbor; Michael J. Schnars, Clarkston; Paul L. DuBois, Flint, all of Mich.

[73] Assignees: General Motors Corporation, Detroit; Delco Electyronic Corp., Kokoma, both of Mich.

[21] Appl. No.: 314,024

[22] Filed: Feb. 23, 1989

[51] Int. Cl.$^5$ .................. G01C 22/00; H03K 21/40
[52] U.S. Cl. ........................... 377/26; 377/34; 377/24.1; 365/189.12
[58] Field of Search .............. 377/24.1, 26, 34; 365/189.12

[56] References Cited

U.S. PATENT DOCUMENTS 4,528,683  7/1985  Henry ..................... 377/34
4,682,287  7/1987  Mizuno et al. ........... 364/561
4,757,522  7/1988  Kieselstein ............... 377/26
4,807,264  2/1989  Bauer ...................... 377/26
4,839,909  6/1989  Warner .................... 377/24.1

Primary Examiner—John S. Heyman
Attorney, Agent, or Firm—Mark A. Navarre

[57] ABSTRACT

A nonvolatile memory has a linear array of memory cells to serially store counts by setting the cells one by one in correspondence with input pulses and when the array is full by resetting the cells one by one for successive pulses. When all the cells are reset a conventional binary counter is incremented and the serial count is repeated for further inputs. This procedure minimizes the erase/write sequences required to count a series of pulses. A shift register having a stage corresponding to each memory cell is used to read out the data from the linear array. Data is loaded from the array into the shift register and shifted out in a serial pulse train to a binary counter.

1 Claim, 2 Drawing Sheets

METHOD AND APPARATUS FOR COUNTING WITH A NONVOLATILE MEMORY

FIELD OF THE INVENTION

This invention relates to a nonvolatile memory used for counting and the method of counting using such a memory.

BACKGROUND OF THE INVENTION

Electronic odometers for automotive vehicles are generally required to store input pulses for the life of the vehicle operation. To assure a permanent record of vehicle usage, even in the event of power loss to the odometer, nonvolatile memories are used. In addition, high resolution is necessary. For example it is desired to store data representing each 0.1 mile of travel. Thus very large numbers of input pulses must be counted and retained without danger of loss. Standard binary counters are able to efficiently store large numbers but such counters utilizing nonvolatile memories are subject to wearing out through repeated erase and write operations.

A traditional scheme for avoiding the high incidence of erase and write operations is to use a volatile memory counter for normal operation and to write the counter contents to a nonvolatile memory only when a loss of power is impending. This requires circuits to detect such power loss, to interrupt normal counting, and to carry out the storage activity. Alternatively, only volatile counters are used for low order registers but battery back-up for the volatile counters is expensive and can drain vehicle batteries over extended periods of nonuse.

Another way of using nonvolatile memories in odometers is to provide a large number of redundant memories for the low order register to distribute the wear caused by the frequent updating of the low order data. The redundant locations are swapped with each other to provide a longer effective life. For example, if 24 bits of data (3 eight bit words) are to be stored in a conventional binary format it can record 128,000 miles with a resolution of 0.1 mile if the second word is limited to 10,000 writes or erasures. It is assumed that 10,000 writes or erasures can be made to the memories yielding an acceptable life span. The two higher order 8 bit words do not require any redundancy since they will not be written to more than 10,000 times. However the lower word will undergo 1.28 million erase/write sequences. To insure that no location is written or erased more than 10,000 times, 128 redundant banks of 8 bit memory or 1024 bits are required to share the load. In addition to the storage locations, logic must be provided to perform read, write and erase operations in individual banks as well as logic to select which banks are to be currently used.

It has further been proposed, as described in the U.S. Pat. No. 4,682,287 to Mizuno et al., to use nonvolatile memories which are linearly arranged to be written to bit by bit in sequence. A first memory has 256 cells and the second memory has 32 cells. Each input pulse represents 1 km and causes a "1" to be written to one of the cells so that the first memory can accumulate 256 km, while each cell is written only once, thereby reducing the frequency of erase/write operations. When the first memory is full it is erased and the second memory is incremented by placing a "1" in one of its cells so that each digit in the second memory represents 256 km. The total memory capacity is (256×32)+256 so that only 8448 km can be stored with the recommended memory sizes and only a resolution of 1 km is offered. In addition, the control of the memory requires a microcomputer or other complex logic circuits.

SUMMARY OF THE INVENTION

It is therefore an object of the invention to provide a memory using a relatively small number of nonvolatile memory (NVM) cells and limited erase/write requirements for each cell while yielding large capacity and fine resolution. For example, the memory is smaller than that of Mizuno et al. and its capacity and resolution are vastly superior.

Another object of the invention is to provide such a memory having simple inexpensive support circuitry for control purposes. A microcomputer is not needed.

A further object of the invention is to provide a method of counting events which requires a low number of read/write operations on a particular cell and yet provides a large counting capacity for the small number of memory cells so that it is particularly useful for NVM applications.

The invention is carried out by the method of counting events in a nonvolatile memory comprising the steps of; setting a first plurality of memory locations to a first state in serial fashion in response to an equal plurality of input events, when a preset number of memory locations have been set to the first state, changing the states of the same memory locations to a second state in serial fashion in response to further input events, so that the preset number of memory locations effectively count two times the preset number of input events, and counting in binary fashion in another plurality of memory locations the number of times the said preset number of memory locations have all been set to the first and then the second state, whereby each binary count represents two times the preset number.

The invention is further carried out by a nonvolatile counter incorporating memory cells having a limited tolerance to repeated erasures comprising; input means for supplying event pulses, a linear array of nonvolatile memory cells, each cell being capable of holding either of first and second states, means coupled to the input means and responsive to event signals for changing the state of each cell, in turn, to a first state for each event pulse and then effective when all the cells have attained the first state to change the state of each cell, in turn, to the second state for each event pulse, means for generating an output signal when all cells have attained the second state, and nonvolatile binary register means for counting the output signals whereby the nonvolatile memory cells have minimal requirements to change state.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE PREFERRED EMBODIMENT

Although the ensuing description is directed to a counter and a counting method especially suitable for vehicle odometers, it is expected that other applications for this technology will be apparent.

Figure 1:
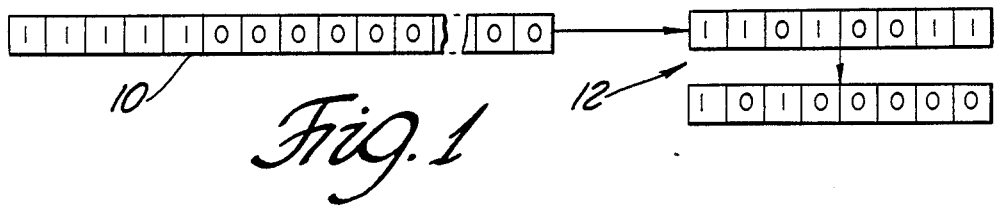
FIG. 1 is a memory state diagram illustrating the method of counting data serially in a linear array for low order data and in a binary register for higher order data, according to the invention.
Figure 2A:
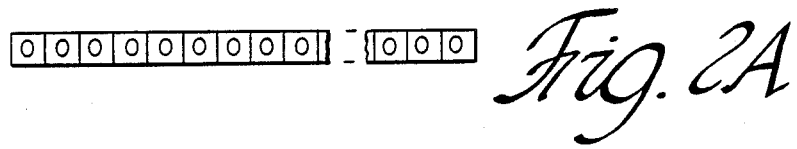
FIGS. 2A, 2B, 2C, and 2D are memory state diagrams illustrating different stages in a counting sequence for the linear array of FIG. 1.
Figure 2B:
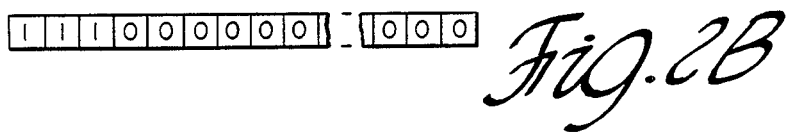
Figure 2C:
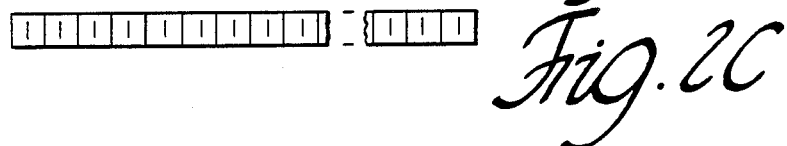
Figure 2D:

The improved NVM counter uses a linear array 10 of memory cells in which cells are written serially for low order data and a conventional binary register 12 for storing high order data, as shown in FIG. 1. Starting with a reset array 10 (all cells in 0 state, as shown in FIG. 2A), the array 10 is incremented by changing the first, second, and third cells in order to the 1 state as the first, second and third input pulses are received (FIG. 2B). This process continues until all the cells of the array 10 are at the 1 state, the most significant digit being the last cell to change (FIG. 2C). Succeeding pulses repeat the process but the cells are serially changed from 1 to 0 (FIG. 2D). The general rule is that the changing cell always changes to the state opposite that of the most significant digit. Finally, when the number of pulses equals two times the number of cells in the array 10, all the cells will have been set to 0. Then the binary register 12 is incremented by 1 and the process repeats for succeeding input pulses.

Applying this arrangement to an odometer, it is appropriate to use 128 cells in the linear array 10 and two 8 bit words in the binary register 12. If an input pulse is applied to the counter for each 0.1 mile traveled, the array will produce an output pulse to the binary register 12 at each 25.6 miles. During that period the array cells will be written once and erased once. After 10,000 output pulses the limit of 10,000 write/erase sequences will be reached in the linear array and the total recorded mileage will be 256,000 miles.

To read the data stored in the memory the cell contents are read out serially and converted to a parallel format like that of the binary register and the sum of the array and register contents is displayed. When the most significant digit of the array is 0 the value of the contents is the number of 1's in the array. When the most significant digit is 1 the number of 0's plus 128 is the value of the contents.

Figure 3:
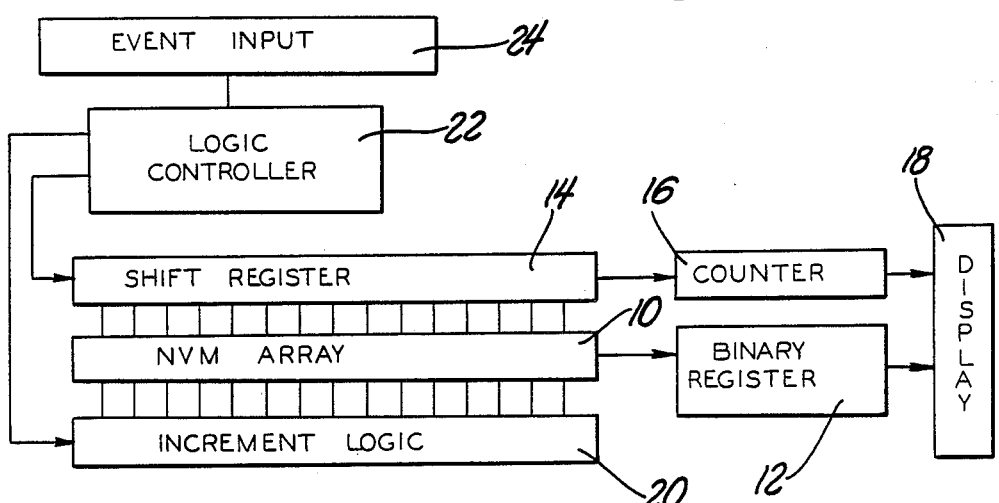
FIG. 3 is a block diagram of the counter according to the invention.

The success of the method of counting depends on the ability to implement an integrated circuit for carrying out the method at a low cost. The circuit to be described is easily implemented as an IC and the support circuitry is relatively simple, requiring a reasonable number of transistors. As shown in FIG. 3, the NVM array 10 is coupled to a dynamic shift register 14 such that a shift register stage is coupled to a corresponding NVM cell. The purpose of the shift register 14 is to read the contents of the array 10 and serially shift the data out to a counter 16 or other circuit for conversion to the parallel format. The contents of the counter 16 is combined with the contents of the binary register 12 and displayed by display 18. Data is incremented in the NVM array 10 by increment logic 20 associated with each NVM cell. A secondary usage of the shift register 14 is that an inverter in each register stage is used in conjunction with the increment logic, but the shifting capability, per se, of the shift register 14 is not involved in the array incrementing process. Both the shift register and the increment logic are controlled by a logic controller 22 which supplies control voltages to each transistor in the circuit. The controller 22 is a relatively simple circuit using only a few hundred transistors to manage the repetitive reading and writing functions of the counter. The event input 24 to the counter is connected to the logic controller 22 to initiate counter incrementing. If the circuit is used as an odometer the event input may be a prescaler responsive to speedometer pulses to generate an input pulse to the controller 22 for each 0.1 mile of travel.

The circuitry requires nonvolatile memory (NVM) transistors which are well known in the art. The NVM transistor may be, for example, an EEPROM cell such as a type described in Shiner et al. "Characterization and Screening of $SiO_2$ Defects in EEPROM Structures," 1983 Proceedings of the 21st Annual Reliability Physics Symposium, p 248-256. Such a transistor requires a high voltage (20 v) for erase and write operations and 5 v and ground for outputting logic 1 and 0, respectively. The transistor is programmed to a reset condition (erased) by placing a high voltage on the drain and ground on the gate. The transistor is programmed to a set state by applying a high voltage to the gate while grounding the drain. In both cases the source is maintained at ground voltage. To read data out of the transistor, a current source is applied to the drain and a logic 1 is applied to the gate. The transistor will conduct the drain current to the source terminal if the transistor is erased and will not conduct if programmed to a set state.

Figure 4:
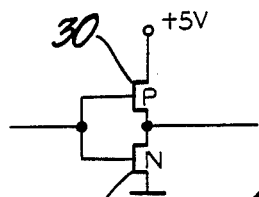
FIG. 4 is a circuit diagram of an inverter used in the shift register of FIG. 3.

The circuit also requires MOS FETs of both the n-channel and the p-channel type. The n-channel FET requires the gate to be at logic 1 for conduction while the p-channel FET requires the gate to be at logic 0 for conduction. To form an inverter as shown in FIG. 4 a p-channel FET 30 and an n-channel FET 34 are serially connected between +5 v and ground. The gates are tied together to form the input and the node between the two FETs is the output. When the input is low the FET 30 conducts to yield a high output and when the input is high the FET 34 conducts to take the output to ground. The gate capacitances of the FETs provide a memory for a signal impressed on the gates provided the gates are otherwise isolated to prevent current drain.

Figure 5:
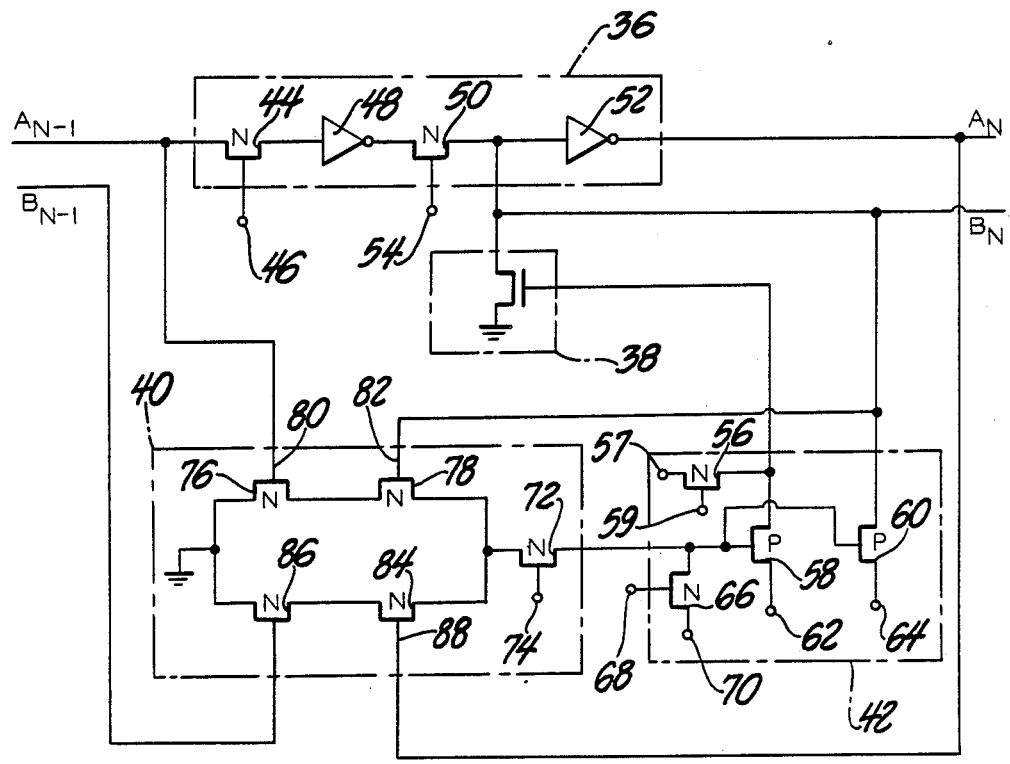
FIG. 5 is a schematic diagram of one memory cell and associated shift register stage and support circuitry for the counter of FIG. 3.

FIG. 5 shows the schematic circuit for one stage 36 of the dynamic shift register 14 and the logic associated with a single NVM cell 38. That logic comprises an increment circuit 40 which compares the state of the cell 38 to that of the previous stage, and read/write circuitry 42. The various circuit terminals identified in FIG. 5 are present in each such stage; corresponding terminals of each stage are bused together for control by the logic controller 22.

The shift register stage 36 comprises a FET 44 with its drain forming the stage input $A_{N-1}$ and having a gate terminal 46 and the source coupled to the input of an inverter 48. The inverter output is connected to the drain of FET 50 which has its source connected to the input of an inverter 52. The inverter 52 output forms the output $A_N$ of the stage 36. The FET 50 has a gate terminal 54. By suitably controlling the gate terminal signals data can be shifted through the stage 36 from the input to the output. By holding gate 46 high and gate 54 low, the input is passed to the inverter 48. Then gate 46 is taken low and the voltage is maintained on the inverter 48 input and the inverted voltage is held at the inverter output independently of any further change at the stage input. The gate 54 is then taken high to pass the voltage to the inverter 52 which produces the signal to its output which is the same as the original input. By connecting the stages 36 end to end, data may be passed from one stage to the next in bucket brigade fashion, thus forming a shift register.

The NVM cell 38 is connected between ground and the input of the inverter 52 in the register stage 36. The gate is connected to control voltages via FETs 56 and 58 in the read/write control 42 and the drain is connected to control voltages through FET 60 in the control 42. As indicated above, terminals 57 and 59 of FET 56 as well as terminals 62 and 64 of FETs 58 and 60 are controlled by the controller 22. The gates of FETs 58 and 60 are connected to FET 66, having control terminals 68 and 70 which are also controlled by the controller 22.

Several steps are required to read data from the NVM cell 38. Terminal 54 and 74 are taken low to isolate the cell 38 from inverter 48 and increment circuit 40; terminals 62 and 64 are taken low and high, respectively, to establish the read voltages for cell 38; and terminals 68 and 70 are taken high and low, respectively, for applying the read voltages to cell 38 via FETs 58 and 60. During such operation, the FET 60 acts as a load for the cell 38, and the high voltage at the drain of FET 60 is stored on the input of inverter 52. Then, terminal 70 of FET 66 is taken high to hold FETs 58 and 60 off, isolating the drain of the NVM cell 38. Then, terminals 57 and 59 of FET 56 are taken high to turn on cell 38. If the cell 38 is at a zero state, it will conduct to pull the input of inverter 52 low; if the cell 38 is at a 1 state, the inverter input will remain high. Thus, the data is loaded from the cell 38 to the stage 36 and appears in inverted form at the stage output. The data is then read out of the linear array of NVM cells by simultaneously loading the data from all the cells to the shift register and serially shifting the data out, in inverted form, to counter 16 where it is counted in binary fashion for compatibility with the contents of the binary register 12.

The increment circuit 40 is an exclusive OR logic circuit which compares the state of the cell 38 to the previous NVM cell in the array, and enables the circuit 42 to change the cell state if it is different from the previous one. An FET 72 having a gate 74 (which is connected to the controller 22) forms an output switch for the circuit 40. FETs 76 and 78 are connected in series between the FET 72 to ground. The gates 80 and 82 of FETs 76 and 78 are connected to lines $A_{N-1}$ and $B_N$ respectively which represent the state of the cell 38 and the inverted state of the previous cell. If both are high, indicating the cells are in different states, the FET 72 is connected to ground. Similarly FETs 84 and 86 are serially connected between the FET 72 and ground and their gates 88 and 90 are connected to lines $A_N$ and $B_{N-1}$ respectively which represent the state of the previous cell and the inverted state of cell 38. If both are high, indicating the cells are in different states, the FET 72 is connected to ground.

In operation, the incrementing is initiated in response to an input signal to the controller 22 which determine a sequence of control signals. First, terminal 74 of FET 72 is taken low to isolate circuits 40 and 42, and then the data is loaded from the NVM cells as described above so that the lines $A_N$, $B_N$, etc. will be charged to the appropriate states. Further, the controller 22 will sense the state of the last NVM cell in the array and prepare to program the opposite state to the next cell to be changed by applying suitable voltages to the terminals 62 and 64 of FETs 58 and 60, the FETs 58 and 60 being biased off by a high voltage stored on their gates via terminal 70 of FET 66, and then FET 66 is turned off to isolate the gates. All the cells in the array are simultaneously prepared in this manner. Then the gate 74 of FET 72 is taken high to allow the FET 72 to conduct. Only one NVM cell in the array will have a state different from its lower order neighbor and its incrementing circuit 40 will ground the gates of FETs 58 and 60 via FET 72 to allow the programming voltages to be applied to that one NVM cell 38.

The entire NVM linear array can be set or reset. Each NVM cell 38 is isolated by turning off FETs 44, 50, 56 and 72 while terminals 68 and 70 are taken high. To bank erase, terminal 64 is taken high (20 v), and terminals 62 and 70 are taken low for sufficient time for the cell to erase. To bank set, the same operation applies but with terminal 64 taken low and terminal 62 taken high.

The embodiments of the invention in which an exclusive property or privilege is claimed are defined as follows:

1. The method of counting events in a nonvolatile memory comprising the steps of:
    setting a first memory location to a first state for the first event,
    incrementing the count at each event by setting another memory location to the same state as the first location so that the number of serial locations in each state depends upon the number of events, when a preset number of locations all attain the same state and further events occur, setting the first location to a second state and then repeating the incrementing step,
    generating an output pulse when each of the preset number of locations has changed state twice,
    counting the output pulses in binary fashion so that each binary count represents twice the preset number,
    loading the contents of the memory locations into corresponding serial volatile memory locations,
    shifting the count states through the volatile locations to produce a serial output signal,
    counting the states in the signal representing recorded events,
    adding the preset number to the count when the first location is in said second state to obtain the serial count total, and
    adding the serial count total to the binary count.

* * * * *